United States Patent
Ogihara et al.

(10) Patent No.: US 7,405,459 B2
(45) Date of Patent: Jul. 29, 2008

(54) SEMICONDUCTOR DEVICE COMPRISING POROUS FILM

(75) Inventors: Tsutomu Ogihara, Niigata-ken (JP); Fujio Yagihashi, Niigata-ken (JP); Hideo Nakagawa, Kadoma (JP); Masaru Sasago, Kadoma (JP)

(73) Assignees: Shin-Etsu Chemical Co. Ltd., Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/652,297

(22) Filed: Jan. 11, 2007

(65) Prior Publication Data

US 2007/0108593 A1 May 17, 2007

Related U.S. Application Data

(62) Division of application No. 10/703,854, filed on Nov. 7, 2003, now Pat. No. 7,244,657.

(30) Foreign Application Priority Data

Nov. 13, 2002 (JP) ............................. 2002-329129

(51) Int. Cl.
  *H01L 23/00* (2006.01)
(52) U.S. Cl. ............... 257/499; 257/522; 257/E23.002; 257/E23.011
(58) Field of Classification Search ........... 257/499, 257/522, E23.002, E23.011
  See application file for complete search history.

(56) References Cited

U.S. PATENT DOCUMENTS 5,625,108 A    4/1997  Perego et al.
5,792,706 A *  8/1998  Michael et al. ............. 438/626
5,888,466 A    3/1999  Perego et al.
6,573,131 B2 * 6/2003  Yan et al. .................... 438/207

FOREIGN PATENT DOCUMENTS

CN    1107803 A    9/1995
CN    1338427 A    3/2002
CN    1346790 A    5/2002

* cited by examiner

*Primary Examiner*—Evan Pert
(74) *Attorney, Agent, or Firm*—Myers Bigel Sibley & Sajovec

(57) ABSTRACT

The present invention provides a zeolite sol which can be formed into a porous film that can be thinned to an intended thickness by a method used in the ordinary semiconductor process, that excels in dielectric properties, adhesion, film consistency and mechanical strength, and that can be easily thinned; a composition for film formation; a porous film and a method for forming the same; and a high-performing and highly reliable semiconductor device which contains this porous film inside. More specifically, the zeolite sol is prepared by hydrolyzing and decomposing a silane compound expressed by a general formula: $Si(OR^1)_4$ (wherein $R^1$ represents a straight-chain or branched alkyl group having 1 to 4 carbons, and when there is more than one $R^1$, the $R^1$s can be independent and the same as or different from each other) in a conventional coating solution for forming a porous film in the presence of a structure-directing agent and a basic catalyst; and then by heating the silane compound at a temperature of 75° C. or lower. A composition for forming a porous film which contains this zeolite sol is used.

4 Claims, 1 Drawing Sheet

SEMICONDUCTOR DEVICE COMPRISING POROUS FILM

RELATED APPLICATIONS

This application is a divisional application of U.S. application Ser. No. 10/703,854 filed on Nov. 7, 2003, now U.S. Pat. No. 7,244,657 which claims priority from Japanese Patent Application No. 2003-329129 filed on Nov. 13, 2002, the disclosures of which are incorporated by reference herein in their entirety.

BACKGROUND OF THE INVENTION

I. Field of the Invention

The present invention relates to a zeolite sol which can be formed into a porous film that excels in dielectric properties, adhesion, film consistency and mechanical strength; a composition for film formation; a porous film and a method for forming the same; and a semiconductor device which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay which is in proportion to the product of the electric resistance of the metal interconnections and the static capacitance between the interconnections. Reducing the interconnection delay time requires reducing the resistance of metal interconnections or the interconnection capacitance.

The reduction in resistance of the interconnection metal and the interconnection capacitance can prevent a densely packed semiconductor device from causing an interconnection delay, thereby realizing a finer and faster semiconductor device with reduced power consumption.

In an attempt to reduce the resistance of metal interconnections, in recent years, metallic copper interconnections have been employed more than conventional aluminum interconnections in the structure of a semiconductor device. However, use of this structure alone has limits in the enhancement of the performance, so the reduction in interconnection capacitance is an urgent necessity for higher performance of semiconductors.

One method for reducing interconnection capacitance is to reduce the relative permittivity (dielectric constant) of an interlevel insulator film disposed between metal interconnections. As such an insulator film with a low relative permittivity, it has been considered to use a porous film instead of a silicon oxide film which had been used conventionally. Since a porous film is the only practical material having a relative permittivity of 2.0 or less which is suitable for an interlevel insulator film, various methods for forming a porous film have been proposed.

A first method for forming a porous film is as follows: a precursor solution of a siloxane polymer containing a thermally unstable organic component is synthesized; then the precursor solution is applied on the substrate to form a coating film; and later, a heat treatment is applied to decompose and volatilize the organic component. The result is a number of micro-pores formed in the film.

As a second method for forming a porous film, it is well known to carry out processing as follows: a silica sol solution is applied onto a substrate by coating or using a CVD method so as to form a wet gel; and then the silica sol is subjected to a condensation reaction while restricting volume reduction by controlling the speed of the evaporation of the solvent from the wet gel.

As a third method for forming a porous film, it is well known that a silica micro-particle solution is applied on a substrate to form a coating film, and then the coating film is sintered to form a number of micro-pores between silica micro-particles.

As a fourth method, Japanese Patent Provisional Publication No. 2000-44875 proposes a composition for porous film formation which contains (A) a component expressed by $R^{1'}{}_m Si(OR^{2'})_{4-m}$ (in the formula, $R^{1'}$ and $R^{2'}$ can be the same or different from each other and each indicates a univalent organic radical, and m is an integer of 0 to 2); (B) a metal chelate compound; and (C) a compound having a polyalkylene oxide structure.

However, these methods have respective major drawbacks as follows.

In the first method for forming a porous film, the synthesis of the precursor solution of the siloxane polymer increases the cost. In addition, the formation of the coating film by coating the precursor solution increases the amount of silanol groups remaining in the coating film, which causes degassing phenomenon indicating the evaporation of water and the like in the heat treatment process that is conducted later and which also deteriorates the film quality due to the porous film absorbing humidity.

In the second method for forming a porous film, the speed control of the evaporation of the solvent from the wet gel requires a special type of coating device, which increases the cost. In addition, a significant amount of silanol remains on the surface of the micro-pores which must be silanized because otherwise hygroscopicity is high and the film quality decreases. The silanization makes the process more complicated. In the case where a wet gel is formed by the CVD process, it is necessary to use a special type of CVD device which is different from the plasma CVD device generally used in the semiconductor process, thereby also increasing the cost.

In the third method for forming a porous film, the diameter of the micro-pores formed between the silica micro-particles, which is determined by the accumulation structure of the silica micro-particles that are accumulated geometrically, becomes very large. This makes it difficult to set the relative permittivity of the porous film to 2 or below.

In the case of the fourth method, out of the three components (A), (B), and (C), the metal chelate compound of (B) is essential to increase the compatibility of the components (A) and (C), and to make the thickness of the coating film uniform after being hardened. However, it is not preferable because it makes the manufacturing process complicated and increases the cost. Therefore, it is desired to develop a material which enables a homogeneous solution to be formed without a chelate component and the coating film to be flat after being hardened.

In comparison to the method for forming a porous member which has conventionally been used, it has been found that a porous member having a channel structure of mesopore size (micro-pores with diameters of 2 nm to 50 nm) can be formed in the following method: alumino silicate, silica or the like is condensed while using a micelle made from a surface active agent as a mold so as to form the structure, and then the surface active agent component is removed by sintering or solvent extraction. For example, Inagaki et al. proposes a method for the reaction of polysilicates in water while using a surface active agent as a mold (J. Chem. Soc. Chem. Commun., p. 680, 1993). Furthermore, Japanese Patent Provisional Publication No. 9-194298 discloses that tetraalkoxysilane is reacted in an acidic condition in water while using a surface active agent as a mold, and is applied onto the substrate so as to form a silica porous film having micro-pores of diameters of 1 to 2 nm.

However, these methods have problems as follows. In the former method, a powdered porous member can be easily formed, but it is impossible to form a porous film as a thin film on a substrate which is used for the fabrication of semiconductor devices. In the latter method, a porous member can be formed into a thin film, but it is impossible to control the orientation of micro-pores, and it is also impossible to form a uniform thin film in a wide area.

Japanese Patent Provisional Publication No. 2001-130911 discloses a method for forming a silica mesoporous thin film by using a mixture of an acid hydrolysis condensate of a silicon alkoxide and a surface active agent after adjusting the mixture to pH3 or below for stabilization.

However, in this method, too, the restriction of the solute concentration makes it difficult to properly control the thickness of a coating film, thereby making it difficult to apply it to a practical semiconductor fabrication process. When this solution is diluted with water, the thickness of the coating film becomes controllable, but the speed of polycondensation of the silica component increases to lose stability of the coating solution.

On the other hand, use of zeolite as the silicon oxide film has been attempted. For example, in Adv. Mater., 2001, 13, No. 10, May 17, p. 746, a zeolite film is prepared by coating tetrapropylammonium hydroxide, tetraethoxysilane and water onto a silicon wafer and processing them in a sealed container. Some other methods have been proposed. For example, according to AIChJ., 42, 3020, (1996), a seed crystal is coated on a supporting member in an autoclave, and a thin water gel solution is used to make only crystal growth progress. According to J. Chem. Soc. Chem. Comm., 1990, 755, a dry gel is turned into zeolite by a mixed vapor of ethylenediamine, triethylamine and water.

However, these methods form a zeolite film in a sealed container such as an autoclave, and are not practically used in a fabrication process for semiconductor devices.

On the other hand, Japanese Patent Publications Nos. 2001-115029 and 2001-203197 show that a coating solution excellent in dielectric properties is prepared by the hydrolysis and condensation of a silane compound. Because it is considered that a coefficient of elasticity must be 5 GPa or higher for use in the actual semiconductor fabrication process, these inventions cannot be said to be satisfactory for mechanical strength.

As described above, the conventional porous films have problems wherein the film consistency is low and the thickness is not properly controllable, and as a result, it is difficult even to prepare a coating film from the material using zeolite sol. Therefore, when a porous film using the conventional zeolite sol is integrated into multilayered interconnections of a semiconductor device as an insulator film, the porous film is difficult to be thinned, the film consistency is low, and the film thickness is not properly controllable. These problems decrease the yield of the semiconductor device fabrication or make the fabrication itself difficult. Furthermore, a porous film with a low mechanical strength deteriorates the reliability of the semiconductor device, even if it can be used for semiconductor fabrication.

SUMMARY OF THE INVENTION

The present invention has an object of providing a zeolite sol which can be formed into a porous film that can be thinned to an intended thickness by a method used in the ordinary semiconductor process, that excels in dielectric properties, adhesion, film consistency and mechanical strength, and that can be easily thinned; a composition for film formation; and a porous film and a method for forming the same. The present invention has another object of providing a high-performing and highly reliable semiconductor device which contains the porous film inside.

As a result of keen studies in an attempt to develop a coating solution for forming the aforementioned porous film, the inventors of the present invention have reached a method for preparing an additive, thereby having completed the present invention. The additive can improve the mechanical strength and dielectric properties of a composition for forming a porous film containing conventional silicon as the main component up to the level of the physical properties applicable to the semiconductor fabrication process by adding a zeolite sol prepared in a specific condition to the composition for forming a porous film.

Zeolite is a general term of crystalline porous alumino silicates. This crystal not only contains a number of pores having diameters of 0.4 to 0.8 nm or so, but also has an extremely high mechanical strength because of its crystal structure. It is known that high silica zeolite is hydrophobic, and its dielectric constant is assumed to be 1.5 to 1.7 or according to a molecular orbital method. The high silica zeolite having such a dielectric constant is suitable for the interlevel insulator film of semiconductor.

The zeolite sol which can be prepared by the method of the present invention has micro-particles of 3 to 15 nm in diameter, and because of these micro-particles, the crystal structure is weaker than the zeolite having a particle diameter of not less than several hundreds nm and having a long distance regulation. However, when the zeolite sol is added to the composition for forming a porous film that has been conventionally used, the zeolite is crystallized inside the coating film by heat treatment during formation of a porous film. This provides the porous film with excellent mechanical characteristics and dielectric properties as zeolite particles.

In the well-known method for preparing a zeolite sol, the hydrolysis and polymerization of silane is promoted by the basic property of a structure-directing agent (R. F. Loboreal., Phenomena and Molecular Recognition in Chem., 98, 21, 47 (1995); S. L. Burkett, M. E. Davis, J. Phys. Chem., 98, 4647 (1994); S. L. Burkett, M. E. Davis, Chem., Mater., 7, 1453 (1995); and M. E. Davis, S. L. Burkett, Zeolite, 12, 33 (1995)). In the present invention, a basic compound different from the structure-directing agent can be added as a hydrolysis catalyst to produce a zeolite sol which can be stable even in the form of fine particles.

In general, zeolite is synthesized at temperature of 200° C. or more by using a silica source, alumina source, alkali metal hydroxide and water, and by way of a highly reactive amorphous hydrogel. The zeolite made from these conventional source materials and method contains too many impurities to be used in a semiconductor device. Therefore, it is necessary to prepare pure zeolite containing no impurities such as metal and halogen. For example, there are well-known methods such as in J. Chem. Soc. Chem. Comm., 2000, 2333 and in J. Am. Chem. Soc., 122, 3530 (2000). However, these methods are intended to prepare zeolite micro-crystallite and can hardly be said to be suitable for a semiconductor fabrication process.

On the other hand, according to J. Phys. Chem., 98, 4647 (1994), Chem. Mater., 7, 920 (1995) and Chem. Mater., 7, 1453 (1995), methods for investigating the reaction mechanism of high silica zeolite are presented. These methods have a purpose of investigating the mechanism of particle formation by finally preparing zeolite particles at reaction temperature of 100° C. or higher, which cannot be said to be methods for preparing micro-particles of 5 nm or smaller.

Hence, the present invention provides a method for preparing a zeolite sol having a preferable particle diameter of 3 to 15 nm, comprising the steps of: hydrolyzing a silane compound expressed by the following general formula (1):

$$Si(OR^1)_4 \quad (1)$$

(wherein $R^1$ represents a straight-chain or branched alkyl group having 1 to 4 carbons, and when there is more than one $R^1$, the $R^1$s can be independent and the same as or different from each other) in the presence of a structure-directing agent and a basic catalyst; and heating the silane compound at a temperature of preferably not more than 75° C., more preferably 30° C. to 75° C., and further more preferably 50° C. to 75° C.

The composition for forming a porous film of the present invention contains the aforementioned zeolite sol. Also, the composition for forming a porous film of the present invention comprises the aforementioned zeolite sol and a composition containing a silicon-containing compound. This attains a composition for forming a porous film which can be formed into a porous film that can be thinned to an intended thickness by a method used in the ordinary semiconductor process, that excels in dielectric properties, adhesion, film consistency and mechanical strength, and that can be easily thinned.

In preparing a mixture of zeolite sol and a composition which contains a silicon-containing compound, the zeolite sol may be preferably mixed in a wet condition thereof with the composition which contains a silicon-containing-compound. This condition prevents secondary agglomeration of the zeolite sol during mixing.

The composition containing silicon may be preferably a silane compound polymer prepared by hydrolyzing and condensing at least one kind of silane compound. This enables a porous film that can have a desired thickness, that excels in dielectric properties, adhesion, film consistency and mechanical strength, and that can be easily thinned to be formed from a composition for forming a porous film containing a mixture of zeolite sol and a composition which contains a silicon-containing compound.

The zeolite sol may be preferably 0.0001 to about 30 parts by weight per 1 part by weight of silane compound polymer. This ratio enables the zeolite sol to be homogeneously dispersed in a solution containing the silane compound polymer.

The porous film of the present invention is prepared by using the aforementioned composition for forming a porous film containing zeolite sol. This can form a porous film that can have an intended thickness, that excels in dielectric properties, adhesion, film consistency and mechanical strength, and that can be easily thinned.

The insulator film of the present invention is prepared by using the aforementioned composition for forming a porous film containing zeolite sol. This can form a porous film that can have an intended thickness so as to be applied to a semiconductor fabrication process, that excels in dielectric properties, adhesion, film consistency and mechanical strength, and that can be easily thinned.

The semiconductor device of the present invention contains a porous film inside, the porous film being prepared by using zeolite sol having a preferable average particle diameter of 3 to 15 nm and by hydrolyzing and condensing a silane compound expressed by the general formula (1):

$$Si(OR^1)_4 \quad (1)$$

(wherein $R^1$ represents a straight-chain or branched alkyl group having 1 to 4 carbons, and when there is more than one $R^1$, the $R^1$s can be independent and the same as or different from each other) in the presence of a structure-directing agent and a basic catalyst; and then heating the silane compound at a temperature of 75° C. or less. More specifically, the aforementioned porous film is used as the insulator film of multilayered interconnections.

The structure-directing agent may be preferably a quaternary organic ammonium hydroxide expressed by the general formula (2):

$$(R^2)_4N^+OH^- \quad (2)$$

wherein $R^2$ represents a straight-chain or branched alkyl group having 1 to 5 carbons, and may be independent and the same as or different from each other.

The basic catalyst may be preferably a compound which is expressed by the general formula (3):

$$(R^3)_3N \quad (3)$$

wherein $R^3$ represents a hydrogen atom, a straight-chain, branched, or cyclic alkyl group or aryl group having 1 to 20 carbons and can be independent and the same as or different from each other, and the hydrogen atom or atoms contained in the alkyl group or the aryl group may be substituted by a hydroxy group or an amino group; or by the general formula (4):

$$(R^4)_nX \quad (4)$$

wherein $R^4$ represents a straight-chain, branched, or cyclic alkyl group or aryl group having 1 to 20 carbons, or a monovalent compound expressed by the general formula (3) and can be independent and the same as or different from each other, and the hydrogen atom or atoms contained in the alkyl group or the aryl group may be substituted by a hydroxy group or an amino group. And n represents an integer of 0 to 3 and X represents an n-valent heterocyclic compound.

This realizes a semiconductor device which contains a porous film having high film consistency, a low dielectric constant, and mechanical strength sufficient for the fabrication of semiconductor devices as an insulator film of the multilayered interconnections. The proper control of the thickness of the porous film facilitates the fabrication of the semiconductor. Since the zeolite-containing film is an insulator film with a low dielectric constant, the parasitic capacitance around the multilayered interconnections is reduced, thereby achieving high-speed and low-power operations of the semiconductor device.

In the semiconductor device of the present invention, the porous film may be preferably present in an insulator film between metal interconnections in the same layer of the multilayered interconnections or in the interlevel insulator film between the vertically stacked metal interconnection layers. This arrangement can achieve a high-performing and highly reliable semiconductor device.

Adding the zeolite sol prepared by the method of the present invention to the composition for forming a porous film enables a porous film having a properly controlled thickness to be formed easily. This porous film is extremely useful particularly as the interlevel insulator film of interconnections in a semiconductor integrated circuit because of its features of having a low dielectric constant and excellent adhesion, film consistency and mechanical strength.

The use of the porous film to which the zeolite sol prepared by the method of the present invention has been added can make it possible to fabricate a highly reliable, high-speed and downsized semiconductor device.

In addition, the use of the porous film made from the composition of the present invention as an insulator film of multilayered interconnections can achieve a high-performing and highly reliable semiconductor device.

DETAILED DESCRIPTION OF THE PREFERRED EMBODIMENTS

Figure 1:
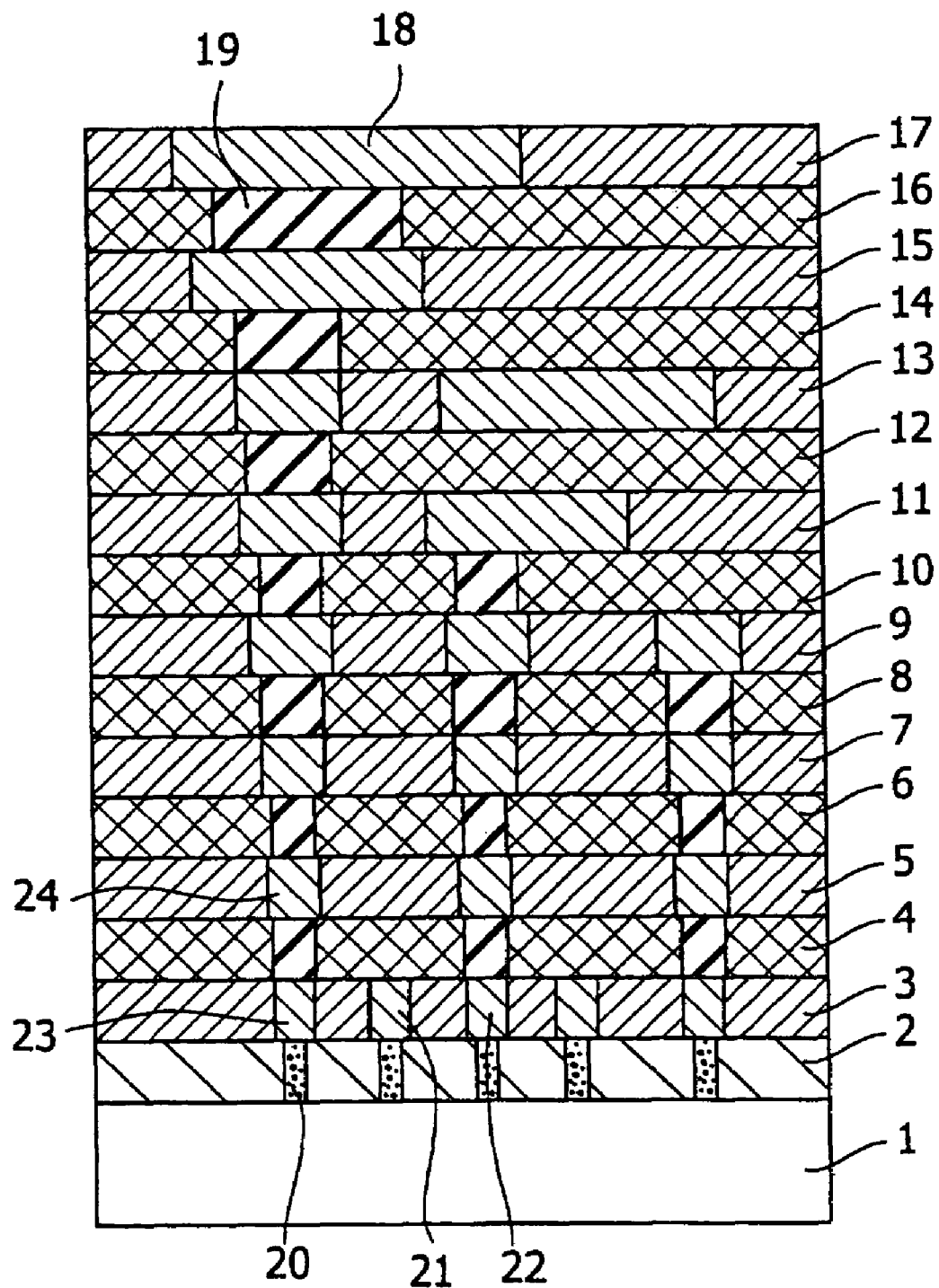
FIG. 1 is an overall cross-sectional view of a semiconductor device of the present invention.

A silane compound used in the present invention is expressed by the general formula (1). The silane compound expressed by the formula (1) can be hydrolyzed in the presence of a structure-directing agent and a basic catalyst and then be subjected to a heat treatment to prepare a zeolite sol.

Here, $R^1$ can specifically include a methyl group, an ethyl group, a propyl group and a butyl group.

Silane compounds preferably used in the present invention may include, but not limited to, tetramethoxysilane, tetraethoxysilane, tetrapropoxysilane, tetrabutoxysilane, tetraisopropoxysilane, tetraisobutoxysilane, triethoxymethoxysilane, tripropoxymethoxysilane, tributoxymethoxysilane, trimethoxyethoxysilane, trimethoxypropoxysilane and trimethoxybutoxysilane.

In the method of the present invention, these silane compounds can be used solely or by mixing two or more of them.

The structure-directing agent used in the present invention is generally known to play an important role in determining the crystal type of zeolite.

It is preferable to use as the structure-directing agent a quaternary organic ammonium hydroxide expressed by the general formula (2):

$$(R^2)_4N^+OH^- \qquad (2)$$

wherein $R^2$ represents a straight-chain or branched alkyl group having 1 to 5 carbons and can be independent and the same as or different from each other.

Here, $R^2$ can specifically include, but not limited to, a methyl group, an ethyl group, a propyl group and a butyl group.

The structure-directing agent can include, but not limited to, tetramethylammonium hydroxide, tetraethylammonium hydroxide, tetrapropylammonium hydroxide, tetrabutylammonium hydroxide, triethylmethylammonium hydroxide, tripropylmethylammonium hydroxide and tributylmethylammonium hydroxide.

In the method for preparing a zeolite sol of the present invention, the structure-directing agent is used by being mixed with a silane compound. The amount of structure-directing agent to be added may be preferably in a molar amount from 0.1 to 20 times and more preferably from 0.5 to 10 times the mol amount of silane compound expressed by the formula (1).

The basic catalyst of the present invention functions to promote the hydrolysis and condensation of a silane compound.

The basic catalyst preferably used may be a compound which is expressed by the general formula (3):

$$(R^3)_3N \qquad (3)$$

wherein $R^3$ represents a hydrogen atom, a straight-chain, branched, or cyclic alkyl group or aryl group having 1 to 20 carbons and may be independent and the same as or different from each other, and the hydrogen atom or atoms contained in the alkyl group or the aryl group can be substituted by a hydroxy group or an amino group; or by the general formula (4):

$$(R^4)_nX \qquad (4)$$

wherein $R^4$ represents a hydrogen atom, a straight-chain, branched, or cyclic alkyl group or aryl group having 1 to 20 carbons, or a monovalent compound expressed by the general formula (3) and may be independent and the same as or different from each other, and the hydrogen atom or atoms contained in the alkyl group or the aryl group can be substituted by a hydroxy group or an amino group. And n represents an integer of 0 to 3 and X represents an n-valent heterocyclic compound containing a nitrogen atom.

In the formula (3), $R^3$ can specifically include, but not limited to, a hydrogen atom, a methyl group, an ethyl group, a propyl group, an isopropyl group, a butyl group, an isobutyl group, a pentyl group, a hexyl group, a heptyl group, an octyl group, a decyl group, a dodecyl group, an octadecyl group, a cyclohexyl group, a phenyl group and a tolyl group.

The basic catalyst expressed by the general formula (3) can include ammonia, methylamine, ethylamine, propylamine, butylamine, pentylamine, dodecylamine, octadecylamine, isopropylamine, t-butylamine, ethylenediamine, 1,2-diaminopropane, 1,3-diaminopropane, hexamethylenediamine, dimethylamine, diethylamine, dipropylamine, diisopropylamine, dibutylamine, trimethylamine, triethylamine, tripropylamine, tributylamine, N,N-dimethyloctylamine, triethanolamine, cyclohexylamine, aniline, N-methylaniline, diphenylamine and toluidines.

In the formula (4), $R^4$ can include a hydrogen atom, methyl, ethyl, propyl, isopropyl, butyl, isobutyl, pentyl, hexyl, heptyl, octyl, decyl, dodecyl, octadecyl, cyclohexyl, phenyl, tolyl, amino, methylamino, ethylamino, propylamino, butylamino, pentylamino, dodecylamino, octadecylamino, isopropylamino, t-butylamino, dimethylamino, diethylamino, dipropylamino, diisopropylamino, dibutylamino, N,N-dimethyloctylamino, cyclohexylamino and diphenylamino.

The X can include, but not limited to, pyrrolidine, piperidine, morpholine, pyridine, pyridazine, pyrimidine, pyrazine and triazine.

The basic catalyst expressed by the general formula (4) can include, but not limited to, pyrrolidine, piperidine, morpholine, pyridine, picolines, phenylpyridines, N, N-dimethylaminopyridine, pyridazine, pyrimidine, pyrazine and triazine.

Above all, the basic catalyst used in the method of the present invention may preferably include ammonia, methylamine, ethylamine, propylamine, isopropylamine, pyrrolidine, piperidine, morpholine and pyridine.

In the method of the present invention, the basic catalysts can be used solely or by mixing two or more of them.

The basic catalyst may be used by being mixed with a silane compound expressed by the general formula (1) and a structure-directing agent expressed by the general formula (2). In this case, the amount of basic catalyst to be added may be preferably in a mol amount from 0.01 to 20 times and more preferably from 0.05 to 10 times the mol amount of the silane compound expressed by the general formula (1).

In the method for preparing a zeolite sol of the present invention, when a zeolite sol is prepared by hydrolyzing and polymerizing a silane compound expressed by the general formula (1), water is added for hydrolysis, in addition to the silane compound, a structure-directing agent, and a basic catalyst. The amount of water to be added may be preferably 0.1 to 100 times and more preferably 0.5 to 20 times in weight as much as that of the silane compound.

In the case where a silane compound expressed by the general formula (1) is hydrolyzed and condensed to prepare a zeolite sol, it is possible to contain a solvent such as alcohol besides water. The alcohol can include methanol, ethanol, isopropyl alcohol, butanol, propylene glycol monomethyl ether, propylene glycol monopropyl ether, propylene glycol monopropyl ether acetate, ethyl lactate and cyclohexanone. The amount of solvent to be added may be preferably 0.1 to 100 times and more preferably 0.5 to 20 times in weight as much as that of the silane compound.

The hydrolysis time may be 1 to 100 hours, and preferably 10 to 70 hours, and the temperature may be 0 to 50° C., and preferably 15 to 30° C.

Heat treatment after hydrolysis may be performed at a temperature of 30° C. or higher, and preferably at a temperature of not less than 50° C. and not more than 75° C. The time of the heat treatment is 1 to 100 hours, and preferably 10 to 70 hours. When the heat treatment time after hydrolysis is too short, it may be difficult to cause a transfer from agglomerated silicon ions to zeolite micro-crystallite, which cannot be expected to improve the physical properties of the composition for forming a porous film. On the other hand, when the heat treatment temperature is more than 75° C., zeolite crystal may grow larger than 15 nm. Such large crystal never causes particles to fuse with each other and crystallize when added to the composition for forming a porous film, so that the ability to crystallize the whole film uniformly is weakened.

The zeolite sol thus prepared is micro-particles having an average particle diameter of 3 to 15 nm, but has an extremely high mechanical strength because it has a crystalline structure identical to the zeolite having a particle diameter of 15 nm or larger. In addition, these particles form a homogeneous micro-porous crystal structure, which provides excellent mechanical strength in spite of the high rate of pore distribution throughout the formed thin film. A combination of the porosity of zeolite and low relative permittivity due to its inherent hydrophobic characteristic makes it possible to obtain a porous film having dielectric properties which are applicable to the semiconductor fabrication process.

In contrast, in the case of commercially available silica sol made from silica aerosol or wet colloidal silica prepared by the basic hydrolysis of alkoxy silane or the deionization of water glass, not only is the mechanical strength low but also the particles themselves do not have micro-pores because the micro-structure of the silica is amorphous. These amorphous silicas are different from the crystalline zeolite sol prepared by the method of the present invention. Therefore, a coating film made from amorphous silica aerosol is low both in mechanical strength and in dielectric properties.

The zeolite sol prepared by the method of the present invention may be in the condition of being dispersed in a reaction solvent such as water or alcohol. Adding this to the silicon-containing composition for forming a porous film which has been conventionally known can yield a porous film having desired strength and a dielectric constant suitable for the interlevel insulator film of semiconductors.

However, if an attempt is made to obtain zeolite by removing the solvent from the zeolite sol dispersed in the prepared reaction solvent, this will cause the secondary agglomeration of zeolite sol, and develop large particles. If this is added to the conventional composition for forming a porous film, not only is the surface of the finished porous film made uneven, but also desirable dielectric and mechanical properties cannot be obtained. To prevent this, the zeolite micro-particles are subjected to a concentration adjustment in a wet condition and mixed with the conventional composition for forming a porous film containing a silicon-containing compound so as to obtain the intended composition for forming a porous film.

Herein, the conventional composition for forming a porous film which contains the silicon-containing compound means all compositions for forming a porous film containing silicon. These compositions, which are known to persons skilled in the art, will be explained as follows.

The zeolite sol of the present invention can provide a composition for forming a porous film by being mixed with a solution containing a polymer which is prepared by hydrolyzing and condensing at least one kind of silane compound expressed by the following general formula (5):

$$(R^5)_n Si(OR^6)_{4-n} \tag{5}$$

wherein $R^5$ represents a straight-chain or branched alkyl group or aryl group having 1 to 8 carbons, which may have a substituent, and when there is more than one $R^5$, the $R^5$s can be independent and the same as or different from each other; $R^6$ represents an alkyl group having 1 to 4 carbons, and when there is more than one $R^6$, the $R^6$s can be independent and the same as or different from each other; and n is an integer of 0 to 3.

In the general formula (5), $R^5$ represents a straight-chain or branched alkyl group or aryl group having 1 to 8 carbons which can have a substituent. The substituent can specifically include a methyl group, an ethyl group, a propyl group, an isopropyl group, a butyl group, an isobutyl group, a sec-butyl group, a tert-butyl group, a pentyl group, a sec-pentyl group, a neopentyl group, a hexyl group, a 2-ethylhexyl group, a heptyl group, an octyl group, a phenyl group, an o-tolyl group, an m-tolyl group, a p-tolyl group, a xylyl group and a benzil group.

In the general formula (5), $R^6$ represents an alkyl group having 1 to 4 carbons. The alkyl group can specifically include a methyl group, an ethyl group, a propyl group, an isopropyl group and a butyl group. In the general formula (5), n is an integer of 0 to 3.

The silane compound in the general formula (5) may include, but not limited to, tetramethoxysilane, tetraethoxysilane, tetrapropoxysilane, tetrabutoxysilane, methyltrimethoxysilane, methyltriethoxysilane, methyltripropoxysilane, ethyltrimethoxysilane, propyltrimethoxysilane, butyltrimethoxysilane, pentyltrimethoxysilane, hexyltrimethoxysilane, 2-ethylhexyltrimethoxysilane, phenyltrimethoxysilane, dimethyldimethoxysilane, dimethyldiethoxysilane, trimethylmethoxysilane, triethylmethoxysilane and butyldimethylmethoxysilane.

These silane compounds are hydrolyzed and condensed to prepare a polymer solution. This hydrolysis and condensation reactions are preferably performed in the presence of water under an acidic condition while using acid as a catalyst so as to prepare a polymer solution. The acid used for the catalyst can include an inorganic acid such as hydrochloric acid, sulfuric acid or nitric acid; a sulfonic acid such as methanesulfonic acid, benzenesulfonic acid, p-toluenesulfonic acid or trifluoromethanesulfonic acid; an organic acid such as formic acid, acetic acid, propionic acid, oxalic acid, malonic acid, fumaric acid, maleic acid, tartaric acid, citric acid and malic acid; and phosphoric acid. The amount of acid catalyst to be added may be 0.001 to 10 parts by weight and more preferably 0.01 to 1 part by weight to that of the silane compound. The amount of water for hydrolysis may be 0.5 to 10 times and more preferably 1.0 to 4.0 times in mol as much as the mol necessary for complete hydrolysis of the silane compound.

The synthesis of the polymer solution can be also performed under alkali conditions. The base used in this case can include ammonia, amines such as ethylamine, propylamine, diisopropylamine, triethylamine and triethanolamine; and alkali metal hydroxides and alkaline-earth metal hydroxides such as sodium hydroxide, potassium hydroxide and calcium hydroxide. The amount of base catalyst to be added may be preferably 0.001 to 10 parts by weight and more preferably 0.01 to 1 part by weight of that of the silane compound.

In the case where a silane compound expressed by the general formula (5) is hydrolyzed and condensed to form a polymer solution, it is possible to contain a solvent such as alcohol corresponding to the alkoxy group of the silane compound besides water. The alcohol can include methanol, ethanol, isopropyl alcohol, butanol, propylene glycol monomethyl ether, propylene glycol monopropyl ether, propylene glycol monopropyl ether acetate, ethyl lactate and cyclohexanone. The amount of solvent to be added other than water may be preferably 0.1 to 500 times and more preferably 1 to 100 times in weight as much as that of the silane compound.

The hydrolysis and condensation reactions of the silane compound expressed by the general formula (5) may be performed under a condition that are used in the ordinary hydrolysis and condensation reactions, and the reaction temperature may be in the range from 0° C. to the boiling point of alcohol which will be generated by the hydrolysis and condensation reactions, and may be preferably between room temperature and 60° C.

The reaction time may not be particularly limited; however, it may be generally from 10 minutes to 18 hours, and more preferably from 30 minutes to 3 hours or so.

The polymer obtained from a silane compound expressed by the general formula (5) has a weight average molecular weight of 500 to 50,000,000 on basis of polystyrene when a gel permeation chromatography (GPC) is used.

Hereinafter, the polymer of a silane compound expressed by the general formula (5) which is the conventional component for a composition for forming a porous film that contains a silicon-containing compound is referred to as a base component.

In general, zeolite sol can be homogeneously dispersed by only being mixed with a solution of the base component and stirred so that a composition for a porous film is obtained.

However, the maximum amount of zeolite sol to be dissolved homogeneously may differ depending on the crystal structure and hydrophobic characteristic of the zeolite sol used. Therefore, the amount of zeolite sol to be added to the base component may change with the type of material to be used. In general, the amount of zeolite sol to be added may be preferably 0.0001 to about 30 parts by weight per 1 part by weight of a silane compound polymer in the base component. When the main focus is to improve the dispersibility of the zeolite sol, it may be preferable that the weight ratio of zeolite sol to the silane compound polymer in the base component is lowered. However, as the reduction in the weight ratio of zeolite sol to the silane compound polymer in the base component decreases, the effect of improving mechanical strength and dielectric properties decrease.

Thus, the proportion of zeolite in weight can be appropriately determined according to the silane compound polymer to be used. This can attain the preparation of a composition for forming a porous film which can be provided with all of the homogeneous dispersibility of zeolite sol in the solution of the base component, high mechanical strength and high dielectric properties after the formation of the porous film.

After preparation of the composition for forming a porous film in this manner, the thin film with a desired thickness can be obtained by controlling the solute concentration of the composition for forming a porous film and performing spin coating at an appropriate number of revolutions. The actual film thickness may become 0.2 to 1 µm or so, but the thickness may not be limited to this range. For example, thicker films can be formed by coating more than one time. Besides spin coating, other coating methods can be used such as scan coating. In this case, the solvent used for dilution can include an aliphatic hydrocarbon solvent such as n-pentane, isopentane, n-hexane, isohexane, n-heptane, 2,2,2-trimethyl pentane, n-octane, isooctane, cyclohexane or methylcyclohexane; an aromatic hydrocarbon solvent such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene or n-amylnaphthalene; a ketone solvent such as acetone, methyl ethyl ketone, methyl n-propyl ketone, methyl n-butyl ketone, methyl isobutyl ketone, cyclohexanone, 2-hexanone, methyl cyclohexanone, 2,4-pentanedione, acetonylacetone, diacetone alcohol, acetophenone or fenthion; an ether solvent such as ethyl ether, isopropyl ether, n-butyl ether, n-hexyl ether, 2-ethylhexyl ether, dioxolane, 4-methyl dioxolane, dioxane, dimethyl dioxane, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyl tetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether or dipropylene glycol dibutyl ether; an ester solvent such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzil acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxy glycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate or diethyl phthalate; a nitrogen-containing solvent such as N-methylformamide, N,N-dimethylformamide, acetamide, N-methylacetamide, N,N- dimethylacetamide, N-methylpropioneamide or N-methylpyrrolidone; or a sulfur-containing solvent such as dimethyl sulfide, diethyl sulfide, thiophene, tetrahydro thiophene, dimethyl sulfoxide sulfolane or 1,3-propanesultone. These materials can be used solely or by mixing two or more thereof.

Although the degree of dilution may depend on the viscosity and intended film thickness, the dilution degree may be generally so determined that the solvent can be 50 to 99 wt %, and preferably 75 to 95 wt %.

The thin film thus prepared may be preferably heated for several minutes at 50 to 150° C. in a drying process (generally called a pre-bake in the semiconductor process) in an attempt to remove the solvent. A porous film is finally obtained.

The prepared thin film has excellent mechanical strength because zeolite having high mechanical strength is uniformly distributed throughout the film, and measurement by nano indentation usually shows a hardness of 0.7 to 5 GPa and a coefficient of elasticity of 5 to 40 GPa or so. This indicates that the acquired thin film has much higher mechanical strength than the case of using the porous material in which pores are generated by adding a thermally decomposable polymer to silicone resin and removing the polymer by heating it, whereby the resulting thin film only exhibits a hardness of 0.05 to 2 GPa and a coefficient of elasticity of 1.0 to 4.0 GPa. This is because the zeolite sol added causes its microparticles to fuse with each other and crystallize in the entire thin film in the drying process.

The porous film prepared by using the composition for forming a porous film to which the zeolite sol prepared by the method of the present invention has been added is low in relative permittivity and particularly preferable as the interlevel insulator film of the interconnections in a semiconductor integrated circuit.

There is a conventional problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process which is generally used in the fabrication process. Particularly, when used as the interlevel insulator film of a semiconductor, the porous film of the present invention with high mechanical strength and low relative permittivity prevents such exfoliation, thereby making it possible to fabricate a high-speed, highly reliable and downsized semiconductor device.

The embodiments of the semiconductor device of the present invention will be described below. FIG. 1 shows an overall cross-sectional view of an example of the semiconductor device of the present invention.

In FIG. 1, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers and the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the interlevel capacitance between the vertical metal interconnections. Therefore, using the porous film of the present invention for all of the interconnection layers and the via layers can greatly reduce the parasitic capacitance of the interconnections. Hence, the use of the porous film of the present invention as insulator films of the interconnections prevents a conventional problem, that is, an increase in the dielectric constant resulting from the porous film absorbing humidity while multilayered interconnections are formed by stacking porous films. As a result, the semiconductor device can perform high-speed and low-power operations.

The porous film of the present invention enables a semiconductor device to have higher mechanical strength by its high mechanical strength, thereby greatly improving the yield of the fabrication and the reliability of the semiconductor device.

The present invention will be described specifically through the following examples, but is not restricted to them.

In the following Examples 1-4, zeolite sol was prepared by the method of the present invention.

EXAMPLE 1

A mixture of 69 g of tetramethoxysilane and 66 g of methanol was dropped over 1 hour at 40° C. into a mixture of 41 g of 28 wt % aqueous ammonia solution, 30 g of ultra pure water, 430 g of methanol, and 163 g of aqueous solution of 1 mol/L of tetrapropylammonium hydroxide. The resultant solution was concentrated at 40° C. to 45° C. and the reaction mixture was stirred for 24 hours at 75° C. so as to obtain a zeolite sol. An attempt was made to measure the particle diameter of this zeolite sol by using a submicron particle size analyzer (measuring limits: 3 nm), but the center of the particle size distribution was 5 nm so that it was impossible to measure the entire particle size distribution. The obtained sol was applied on a glass preparation and heated to 100° C. to evaporate moisture, and its crystalline structure was measured by using an X-ray diffraction device. Consequently, a minor crystalline structure was found. The structure of zeolite sol obtained was measured as follows.

1. Determination of Zeolite Structure

After having been powdered by vacuum drying, the zeolite sol was measured by using an X-ray diffraction device: M18XHF-SRA (from MAC Science Co., Ltd.).

2. Measurement of Zeolite Particle Diameter

The zeolite particle diameter was measured by a laser scattering method using a submicron particle size analyzer N4 Plus (from Coulter, Inc.).

EXAMPLE 2

Another zeolite sol was prepared in the same manner as in Example 1 except that 210 g of aqueous solution of 1 mol/L tetrabutylammonium hydroxide was used instead of 163 g of aqueous solution of 1 mol/L tetrapropylammonium hydroxide.

EXAMPLE 3

Another zeolite sol was prepared in the same manner as in Example 1 except that 94 g of tetraethoxysilane was used instead of 69 g of tetramethoxysilane.

EXAMPLE 4

A mixture of 69 g of tetramethoxysilane and 66 g of methanol was dropped over 1 hour at 40° C. into a mixture of 65 g of 40 wt % aqueous methylamine solution of, 30 g of ultra pure water, 430 g of methanol and 163 g of aqueous solution of 1 mol/L tetrapropylammonium hydroxide. The resultant solution was condensed at 40 to 45° C., and the reaction mixture was stirred for 24 hours at 75° C. so as to obtain a zeolite sol.

In the following Coating Examples 1 to 4, the zeolite sols obtained in Examples 1 to 4 were added to a base component to prepare a composition for forming a porous film. Then, a porous film was formed and its physical properties were measured by the following methods.

1. Relative Permittivity

Relative permittivity was measured by a CV method with an automatic mercury probe, by using a 495 CV Measurement System (from SSM Japan).

2. Coefficient of Elasticity

Coefficient elasticity was measured by using a nano indicator (from Nano Instruments, Inc.).

COATING EXAMPLE 1

After mixing 8 g of 28 wt % aqueous ammonia solution, 512 g of ultra pure water and 960 g of ethanol at room temperature, 32 g of tetraethoxy silane and 24 g of methyl trimethoxy silane were added thereto and stirred for 4 hours at 65° C. Then, 320 g of propylene glycol monopropyl ether was added to the obtained reaction solution and was condensed until the weight of the solution reached 320 g, thereby obtaining a base component. Then, 2 g of the zeolite sol of Example 1 was added to 50 g of the base component and stirred thoroughly so as to obtain a composition for forming a porous film.

The composition for forming a porous film thus obtained was spin-coated for 1 minute at 4000 rpm by using a spin coater so as to form a film on an 8-inch wafer. This film had a thickness of 7,800 Å when heated for 2 minutes at 120° C. by using a hot plate. The film was further heated for 3 minutes at 250° C. and then heated for 1 hour at 450° C. in an atmosphere of nitrogen by using a clean oven. The thickness at this moment was 7,200 Å. The porous film thus formed had a relative permittivity of 2.1 and a coefficient of elasticity of 5.5 GPa.

COATING EXAMPLES 2 to 4

Porous films were prepared in the same manner as in Coating Example 1 except that 4 g of each of the respective zeolite sols produced in Examples 2, 3, and 4 was added to 50 g of the base component prepared in Coating Example 1. The physical properties of the obtained porous films are shown in Table 1 below.

TABLE 1

|  | Relative permittivity | Coefficient of elasticity/GPa |
|---|---|---|
| Coating Example 1 | 2.1 | 5.5 |
| Coating Example 2 | 2.1 | 6.5 |
| Coating Example 3 | 2.2 | 5.8 |
| Coating Example 4 | 2.1 | 5.5 |

COMPARATIVE COATING EXAMPLE 1

A composition solution for coating was prepared in the same manner as in Coating Example 1 except that 4 g of SNOWTEX ST-XS (from Nissan Chemical Industries, LTD., average particle diameter: 4 to 6 nm), which is a commercially available amorphous silica sol, was used instead of the zeolite sol. Furthermore, a porous film was prepared in the same manner as coating and drying in Coating Example 1. The relative permittivity and coefficient of elasticity in this case are shown in Table 2. These results indicate that the addition of the commercially available amorphous silica sol to the composition does not meet the required values for relative permittivity and coefficient of elasticity as an interlevel insulator film.

COMPARATIVE COATING EXAMPLE 2

A composition solution for forming a porous film was prepared in the same manner as in Coating Example 1 except that no zeolite sol was added. The relative permittivity and coefficient of elasticity in this case are shown in Table 2. These results indicate that the composition solution having no zeolite sol therein does not meet the required values for relative permittivity and coefficient of elasticity as an interlevel insulator film.

TABLE 2

|  | Relative permittivity | Coefficient of elasticity/GPa |
|---|---|---|
| Coating Example 1 | 2.8 | 3.5 |
| Coating Example 2 | 2.5 | 1.8 |

What is claimed is:

1. A semiconductor device containing a porous film inside, wherein the porous film is formed on a substrate from a composition comprising a zeolite sol having an average particle diameter of 3 to 15 nm, and wherein the zeolite sol is prepared by a method comprising the steps of:
   a) hydrolyzing and condensing a tetraalkoxylsilane compound expressed by formula (1):

$$Si(OR^1)_4 \tag{1}$$

in the presence of a structure-directing agent and a basic catalyst, wherein $R^1$ represents a straight-chain or branched alkyl group having 1 to 4 carbons, and when there is more than one $R^1$, the $R^1$s can be independent and the same as or different from each other, and
   b) heating the tetraalkoxylsilane compound at a temperature of 75° C. or lower.

2. The semiconductor device according to claim 1, wherein the structure-directing agent is a quaternary organic ammonium hydroxide expressed by formula (2):

$$(R^2)_4N^+OH^- \tag{2}$$

wherein $R^2$ represents a straight-chain or branched alkyl group having 1 to 5 carbons, and may be independent and the same as or different from each other.

3. The semiconductor device according to claim 1, wherein the basic catalyst is a compound which is expressed by formula (3):

$$(R^3)_3N \tag{3}$$

wherein $R^3$ represents a hydrogen atom, a straight-chain, branched, or cyclic alkyl group or aryl group having 1 to 20 carbons and may be independent and the same as or different from each other, and the hydrogen atom or atoms contained in the alkyl group or the aryl group may be substituted by a hydroxy group or an amino group, or by formula (4):

$$(R^4)_nX \tag{4}$$

wherein $R^4$ represents a hydrogen atom, a straight-chain, branched, or cyclic alkyl group or aryl group having 1 to 20 carbons, or a monovalent compound expressed by the general formula (3) and may be independent and the same as or different from each other, and the hydrogen atom or atoms contained in the alkyl group or the aryl group may be substituted by a hydroxy group or an amino group; n represents an integer of 0 to 3; and X represents an n-valent heterocyclic compound containing a nitrogen atom.

4. The semiconductor device according to claim 1, wherein the porous film is present in an insulator film between metal interconnections in a same layer of multilayered interconnections, or in an interlevel insulator film between vertical metal interconnection layers.

* * * * *